United States Patent
Humphries et al.

(10) Patent No.: US 9,728,732 B2
(45) Date of Patent: Aug. 8, 2017

(54) LIGHT EMITTING POLYMERS AND DEVICES

(75) Inventors: Martin Humphries, Godmanchester (GB); Torsten Bünnagel, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 772 days.

(21) Appl. No.: 14/237,150

(22) PCT Filed: Aug. 3, 2012

(86) PCT No.: PCT/GB2012/051889
§ 371 (c)(1),
(2), (4) Date: Jun. 10, 2014

(87) PCT Pub. No.: WO2013/021180
PCT Pub. Date: Feb. 14, 2013

(65) Prior Publication Data
US 2014/0291651 A1    Oct. 2, 2014

(30) Foreign Application Priority Data
Aug. 5, 2011 (GB) .................................. 1113563.9

(51) Int. Cl.
| | |
|---|---|
| *H01L 51/00* | (2006.01) |
| *H01L 51/50* | (2006.01) |
| *C09K 11/06* | (2006.01) |
| *H05B 33/14* | (2006.01) |
| *C08G 61/12* | (2006.01) |

(52) U.S. Cl.
CPC .......... *H01L 51/0085* (2013.01); *C09K 11/06* (2013.01); *H01L 51/0038* (2013.01); *H01L 51/0039* (2013.01); *H01L 51/0043* (2013.01); *H01L 51/504* (2013.01); *H05B 33/14* (2013.01); *C08G 61/12* (2013.01); *C08G 2261/146* (2013.01); *C08G 2261/1526* (2013.01); *C08G 2261/1624* (2013.01); *C08G 2261/3142* (2013.01); *C08G 2261/3162* (2013.01); *C08G 2261/3221* (2013.01); *C08G 2261/411* (2013.01); *C08G 2261/5242* (2013.01); *C08G 2261/95* (2013.01); *C09K 2211/1433* (2013.01); *C09K 2211/1466* (2013.01)

(58) Field of Classification Search
None
See application file for complete search history.

(56) References Cited

U.S. PATENT DOCUMENTS

| | | |
|---|---|---|
| 2008/0026477 A1 | 1/2008 | Cella et al. |
| 2010/0033086 A1 | 2/2010 | Mikami et al. |
| 2010/0133992 A1 | 6/2010 | Yang et al. |

FOREIGN PATENT DOCUMENTS

| | | |
|---|---|---|
| CN | 101 775 122 A | 7/2010 |
| EP | 2 298 828 A1 | 3/2011 |
| EP | 2 392 604 A1 | 12/2011 |
| EP | 2 492 988 A1 | 8/2012 |
| WO | WO 2004/029134 A1 | 4/2004 |
| WO | WO 2004/113421 A1 | 12/2004 |
| WO | WO 2005/010081 A1 | 2/2005 |
| WO | WO 2009/079039 A1 | 6/2009 |
| WO | WO 2010/065178 A1 | 6/2010 |

OTHER PUBLICATIONS

Examination Report dated Feb. 17, 2017 for Application No. EP 12768877.8.
Office communication dated Mar. 29, 2017 for Application No. JP 2014-523399.

*Primary Examiner* — Kamal Saeed
(74) *Attorney, Agent, or Firm* — Wolf, Greenfield & Sacks, P.C.

(57) ABSTRACT

A polymer comprising units α, β, γ and δ wherein: unit α is present at 30 mole % to 60 mole % and is an optionally substituted arylene; unit β is present at 1 mole % to 30 mole % and is a unit comprising an optionally substituted fluorene; unit γ is present at 1 mole % to 40 mole % and comprises aryl substituted nitrogen, or an optionally substituted triazine; unit δ is present at 0.5 mole % to 15 mole % and comprises an iridium complex; and optionally up to 20 mole % of other units if the total of α, β, γ and δ is less than 100 mole %.

15 Claims, 1 Drawing Sheet

LIGHT EMITTING POLYMERS AND DEVICES

RELATED APPLICATIONS

The present application is a national stage filing under 35 U.S.C. §371 of international PCT application, PCT/GB2012/051889, filed Aug. 3, 2012, which claims priority to United Kingdom patent application, GB 1113563.9, filed Aug. 5, 2011, each of which is incorporated herein by reference.

FIELD OF THE INVENTION

The present invention relates to light emitting polymers and devices. More particularly, the present invention relates to polymers which emit green light and devices which contain such polymers, particularly displays and white light emitting devices.

BACKGROUND TO THE INVENTION

It is known that Organic Light Emitting Diode (OLED) devices can form displays and can also be configured to emit white light and, as such have utility in providing, inter alia, computer monitors, mobile phone displays, televisions, and cheap and efficient lighting for homes, buildings, offices and so on.

In order, for example, to provide a white light OLED one possible device configuration is to have red, green and blue light-emissive species appropriately provided within the device to ensure that the total emitted light is suitable for e.g. general lighting purposes. The provision of distinct red, green and blue emitters within a single device, either within a single layer or in a multilayer device, can lead to performance issues and/or to complexities in device manufacture. For example, it is possible to blend different colour emitters together but this can cause reduced emission intensities in certain cases.

In manufacturing electroluminescent devices such as white light emitting devices, multiple electroluminescent layers may be stacked upon one another, whereby each layer comprises an electroluminescent material having an emission spectrum which differs from that of the other layers. For instance, a multilayer device may comprise a red emission layer, a green emission layer and a blue emission layer. However, such multilayer architecture can result in devices which have low efficiency and/or experience quenching. For example, emission from the triplet state of a phosphorescent emitter may be quenched if a nearby fluorescent emitter that emits from a singlet state also possesses a triplet state of lower energy than the triplet level of the phosphorescent emitter.

To provide OLED displays one possible configuration is to have individually addressable pixels comprising red, green and blue light-emissive species. In such displays, the efficiency (measured for example in Cd/A), quantum efficiency, driving voltage, and lifetime are important operational parameters.

United States Patent Application No 2008/0100199A1 ("The US Application"), discloses polymer material comprising a conjugated polymer and a dendrimer, which may allow manufacture of, for example, a white-light emitting device or green display device that offers the benefits of a lower voltage driving requirement when the polymer is used for a light emitting layer in such a device. This US Application discloses a wide range of monomers that could be employed and its examples note that the dendrimer could be physically mixed into a polymer or could be chemical reacted so that the polymer could contain the dendrimer, for example at the end thereof.

Although the invention described in the US Application represents useful materials that advanced the art, it is believed that further improvements may be made. Thus, for example, it is desired to obtain green emitting materials for use in display or white light emitting devices with good lifetimes and high efficiency while using relatively low levels of expensive metals such as iridium.

SUMMARY OF THE INVENTION

It has been found that incorporation of green emitting iridium complexes, for example green phosphorescent dendrimers having an iridium core, wherein the iridum complex is pendant to the backbone of certain polymers can give enhanced lifetime, improved hole transport, and/or reduced emissive metal requirements in display or white light emitting devices (for example, in comparison to materials in which emissive dendrimers are incorporated into the backbone of the polymers; or in comparison to systems in which dendrimer is physically mixed with polymer). The use of such polymers can reduce demand for iridium (for example, in comparison to analogous systems where the dendrimer is physically mixed with the polymer).

Accordingly, the present invention provides a polymer which can emit green light and is suitable for use together with other emitters in a display or white light emitting device, which polymer comprises units $\alpha$, $\beta$, $\gamma$ and $\delta$ wherein:

unit $\alpha$ is present at 30 mole % to 60 mole % and is an optionally substituted arylene;

unit $\beta$ is present at 1 mole % to 30 mole % and is a unit comprising optionally substituted fluorene;

unit $\gamma$ is present at 1 mole % to 40 mole % and comprises aryl substituted nitrogen, or an optionally substituted triazine;

unit $\delta$ is present at 0.5 mole % to 15 mole % and comprise an iridium complex;

and optionally up to 20 mole %, optionally up to 10 mol %, of other units where the total of $\alpha$, $\beta$, $\gamma$ and $\delta$ is less than 100%.

Each of unit $\alpha$, unit $\beta$, unit $\gamma$ and unit $\delta$ may be a single moiety or a mixture of moieties as defined above.

Unit $\gamma$ may have two arylene groups and an aryl group attached to nitrogen.

DESCRIPTION OF THE DRAWINGS

The invention will now be described in more detail with reference to the drawings in which.

DETAILED DESCRIPTION OF THE INVENTION

Figure 1:
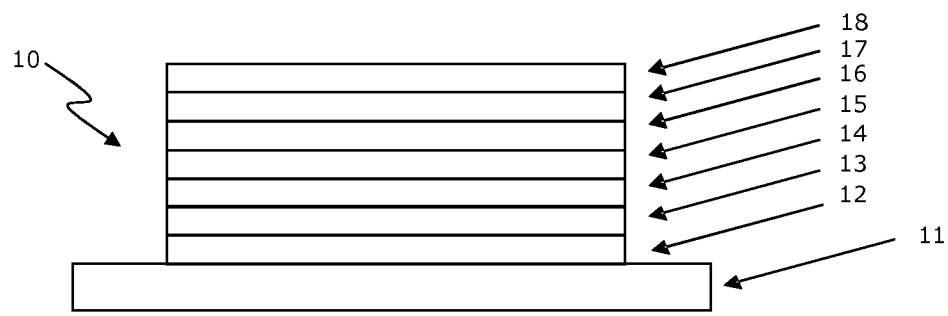
FIG. 1 illustrates an OLED according to an embodiment of the invention.

Accordingly, the present invention provides a polymer which can emit green light and is suitable for use either alone or together with other emitters in a display device or white light emitting device, which polymer comprises units $\alpha$, $\beta$, $\gamma$ and $\delta$ wherein:

unit α is present at 30 mole % to 60 mole % and is an optionally substituted arylene;

unit β is present at 1 mole % to 30 mole % and is a unit comprising an optionally substituted fluorene;

unit γ is present at 1 mole % to 40 mole % and comprises aryl substituted nitrogen, or an optionally substituted triazine;

unit δ is present at 0.5 mole % to 15 mole % and comprise an iridium complex;

and optionally up to 20 mole % of other units where the total of α, β, γ and δ is less than 100%.

Each of unit α, unit β, unit γ and unit δ may be a single moiety or a mixture of moieties as defined above.

Unit α may be an optionally substituted phenylene, biphenylene or naphthylene. Preferably, α is optionally substituted phenylene, particularly an optionally substituted 1,4-phenylene such as 2,5-disubstituted-1,4-phenylene. Suitable substituents are chemically inert and may include alkyl, alkenyl, alkoxyl, alkenyloxy, aryl, aryloxy, alkylthio, alkenylthio, acryl, arylalkyl, arylalkyloxy or the like, comprising up to 14 carbon atoms, and may be fluorinated or polyfluorinated. Substituents may, for example, be selected to improve solution processibility or other properties of the polymer.

The alkyl or alkenyl or other group may be linear or branched or cyclic. Often such groups contain from 3 to 12 carbon atoms. Hence, specific alkyl groups include methyl, ethyl, propyl (n- and i-), butyl (n-, i-, s- and t-), and straight and analogous branched pentyl, hexyl, octyl, nonyl, decyl, undecyl and dodecyl groups, for example hexyl, 2-ethylhexyl, nonyl, and 3,7-dimethyl octyl.

Particularly apt arylene units this includes are 2,5-dialkyl-1,4-diphenyl groups wherein the alkyl is of 6 to 12 carbon atoms. 2,5-dihexyl-1,4-diphenylene is a favoured unit α.

The unit α may comprise, for example, 1 or 2 or more such moieties but aptly comprises one such moiety.

Unit α is present by from 30 mole % to 60 mole %, more generally from 35 mole % to 55 mole %, for example 35±5 mole %, 40±5 mole %, 50±5 mole %. Aptly, unit α is present at 50±5 mole %, for example 45, 46, 47, 48, 49, 50, 51, 52, 53, 54 or 55 mole % of which 50 mole % is a favourable amount.

Unit β may be an optionally substitute fluorene of the formula (1):

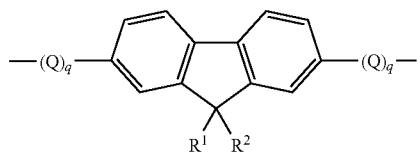

(1)

where $R^1$ and $R^2$ are independently alkyl, alkaryl, aralkyl, aryl, heteroaryl, or substituted aralkyl or aryl groups of up to 20 carbon atoms where the substituent on the aralkyl or aryl group is one lower alkyl group or two lower alkyl groups optionally linked to form a ring of 4 to 6 carbon atoms; and where q is 0 or 1 and Q is attached to the fluorene through the nitrogen atom of a group of formula (2):

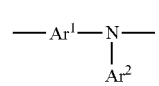

(2)

wherein $Ar^1$ is a phenylene group optionally substituted by a one or two lower alkyl or lower alkoxy groups and $Ar^2$ is a phenyl group optionally substituted by one or two lower alkyl or lower alkoxy groups.

The term "lower" means that the group contains 1 to 8 carbon atoms, for example a methyl group.

In certain apt units β, $R^1$ and $R^2$ are the same.

Suitable values for $R^1$ and $R^2$ include alkyl of up to 20 carbon atoms, for example of 6 to 12 carbon atoms, such as octyl. Other alkyl groups may be as set forth above in the description of unit α. Other suitable values for $R^1$ and $R^2$ include alkenyl groups of up to 20 carbon atoms, for example 3 to 8 carbon atoms, for example pent-5-enyl. Other suitable values for $R^1$ and $R^2$ are phenyl groups optionally substituted by one or two lower alkyl groups or a cyclobutyl ring, for example 3,4-cyclobutylphenyl or 2-hexylphenyl or 4-hexylphenyl.

A suitable value for $Ar^1$ is phenylene, optionally substituted by lower alkyl, for example a 4-loweralkylphenyl such as 1,4-phenylene.

A suitable value for $Ar^2$ is phenyl substituted by lower alkyl, for example 4-methylphenyl.

Suitably q is 0. Suitably q is 1.

Unit β may comprise a 1, 2 or more moieties. Aptly it may comprise a component wherein q is 0 and a second component wherein q is 1.

Unit β is present by from 1 mole % to 35 mole % of the polymer, for example 10 mole % to 25 mole %, such as about 5 mole % to 30 mole % of the polymer, for example about 10 mole % to 20 mole % of the polymer.

Suitable units β alone or in mixtures include:

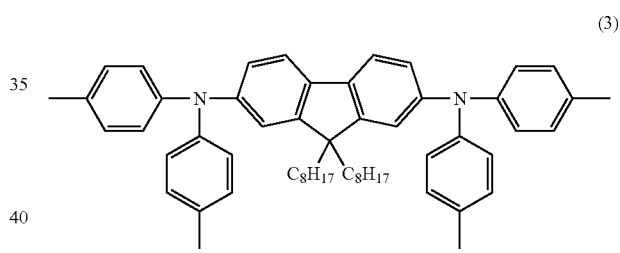

(3)

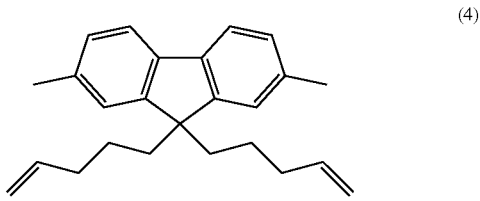

(4)

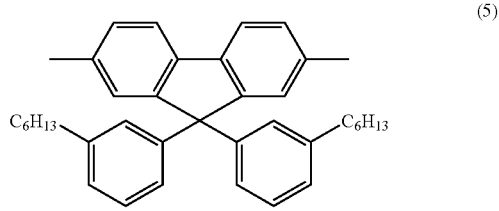

(5)

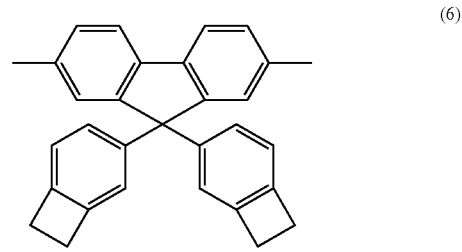

(6)

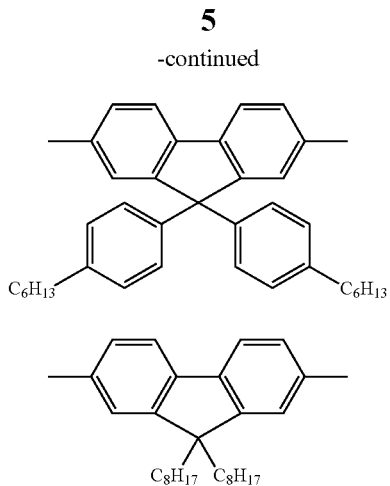

(7)

(8)

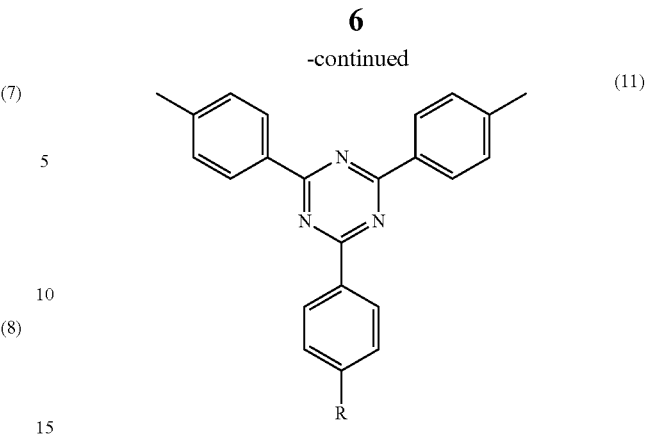

(11)

wherein R of compound (11) is substituent, preferably alkyl, more preferably $C_1$-$C_{12}$ alkyl.

Unit β is present at 1 mole % to 30 mole % in the polymer for example 10 mole % to 28 mole % of which 20%±mole 5% if often particularly apt 15 mole %, 16 mole %, 17 mole %, 18 mole %, 19 mole %, 20 mole %, 21 mole %, 22 mole %, 23 mole %, 24 mole %, or 25 mole %.

Unit γ is a compound containing two arylene groups and one aryl group carried on a nitrogen containing core which may be a nitrogen atom or a triazine group. The unit is linked to the polymer through attachment to two different arylene groups. The aryl groups are aptly phenyl groups optionally substituted by one alkyl group of 1 to 20 carbon atoms, or by two alkyl groups of 1 to 10 carbon atoms optionally linked to form a fused carbocyclic ring of 4 to 6 carbon atoms. More suitably the phenyl group is optionally substituted by an alkyl group of 1 to 10 carbon atoms such as butyl, or a fused carbocyclic of 4 to 6 carbon atoms, or hexyl group, for example 2-butyl group or n-hexyl group or a fused carbocyclic group of 4 carbon atoms. The arylene groups are most suitably phenylene groups such as 1,4-phenylene.

Apt unit γ therefore include groups of the formula:

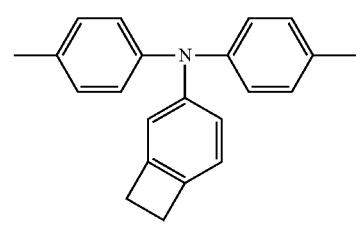

(9)

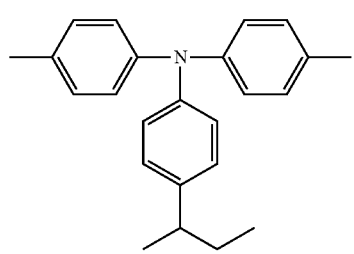

(10)

Unit γ may be a single moiety or a two or more moieties as defined above. Thus, for example, unit γ may comprise a single trisubstituted triazine or a single triarylamine, more than one of each of these types or, as can be favoured, one of trisubstituted triazine and one triarylamine. The specific trisubstituted triazine shown immediately above is a particularly apt unit γ when the sole unit γ or when used in combination with one of the specific triarylamines shown immediately above.

Unit γ may be present by from 1 mole % to 40 mole %, for example 10 mole % to 30 mole % of which 20%±5 mole % is often particularly apt, for example 15 mole %, 16 mole %, 17 mole %, 18 mole %, 19 mole %, 20 mole %, 21 mole %, 22 mole %, 23 mole %, 24 mole %, or 25 mole %.

Unit δ is, or contains, an iridium complex, for example an iridium containing dendrimer, that may be capable of emitting green light. In the case of a dendrimer, the dendrimer may be attached to the polymer chain at two points of the same dendron.

As used herein, the term "dendrimer" means a core such as a metal complex e.g. an iridium core, to which is attached at least one ligand having at least one branchpoint, such a ligand termed herein a "dendron".

Exemplary dendrimers δ possess an iridium core and three ligands of which at least one is a dendron. An exemplary iridium complex has phenylpyridine containing ligand moieties or derivatives thereof bound to iridium for example a Ir(ppy)$_3$ In such exemplary dendrimers δ the pyridyl, or more aptly the phenyl, residue will be substituted by a dendron having a phenyl group forming a branchpoint that in turn may be substituted by two phenyl groups each of which is optionally substituted by a group (sometimes referred to as a surface group) which may be an alkyl or alkoxy group of up to 20 carbon atoms, more usually an alkyl group of 1 to 10 carbon atoms, for example alkyl of 2 to 6 carbon atoms such as a t-butyl group. A preferred dendrimeric branching group is 3,5-diphenylbenzene wherein the central benzene branchpoint group is bound directly to the chelating group of the ligand, and the branching 3- and 5-phenyl groups may be substituted with one or more substituents.

Suitable specific iridium complexes include those of the formulas:

(12)
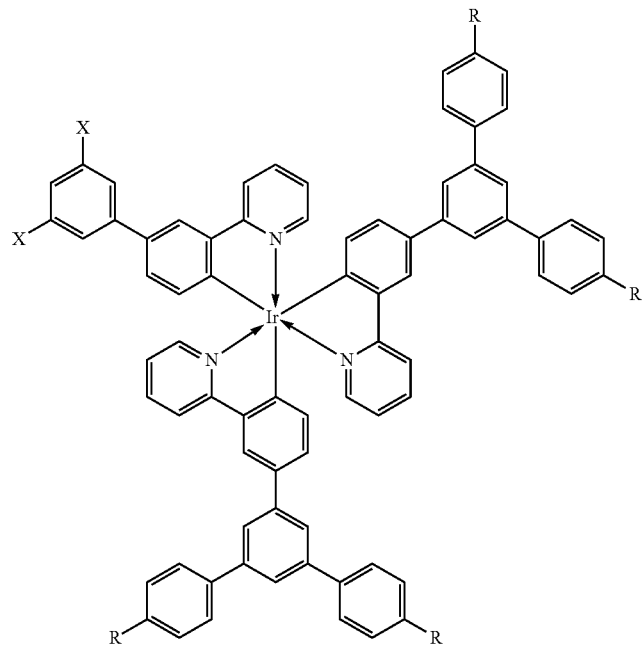
(13)
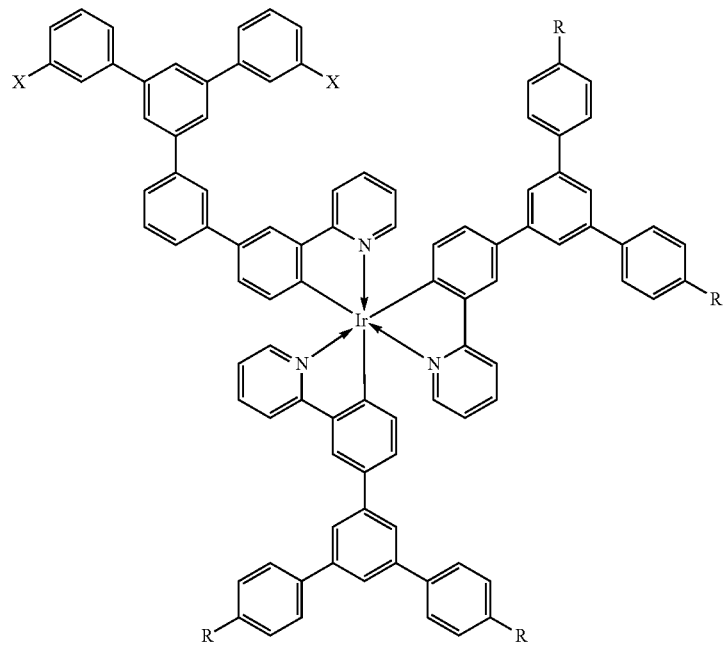

(14)
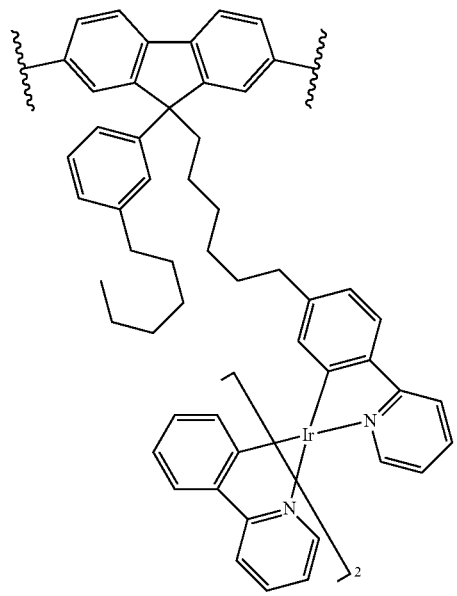
(15)
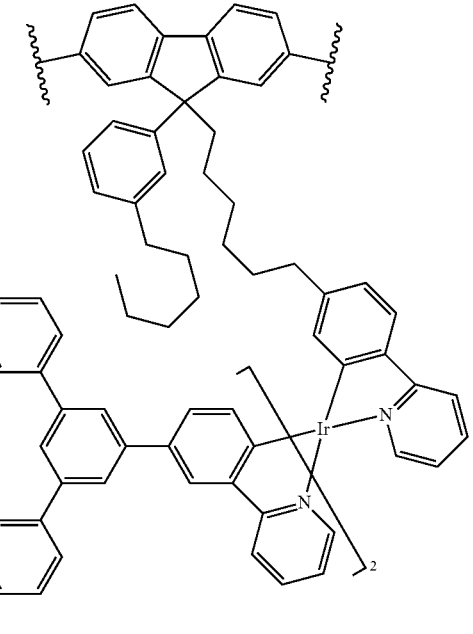
(16)
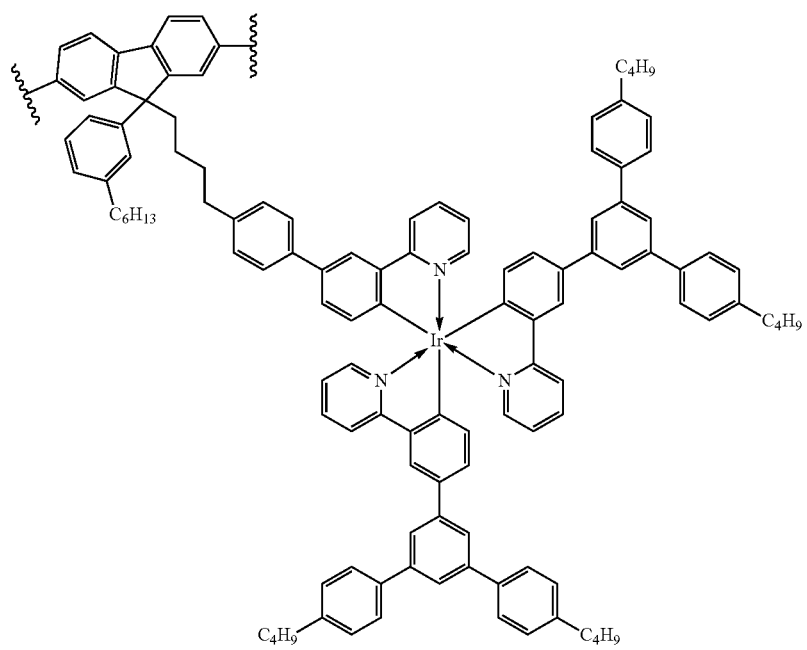

-continued

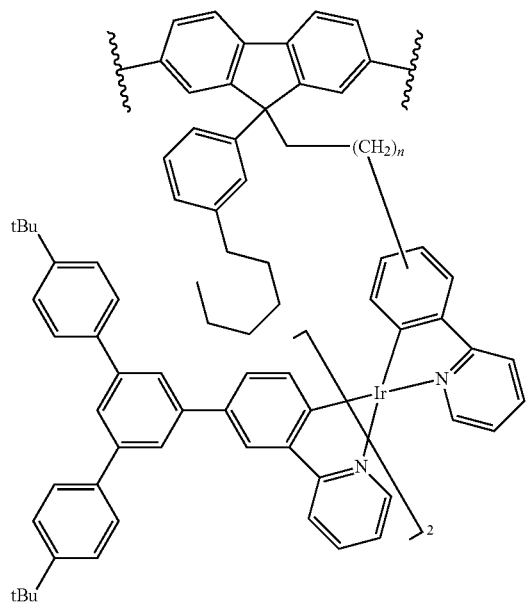

(16.1)

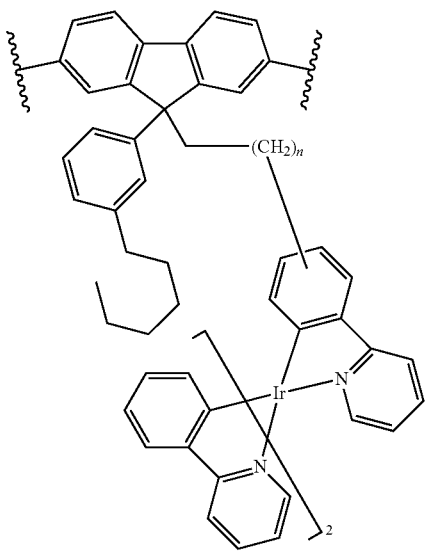

(16.2)

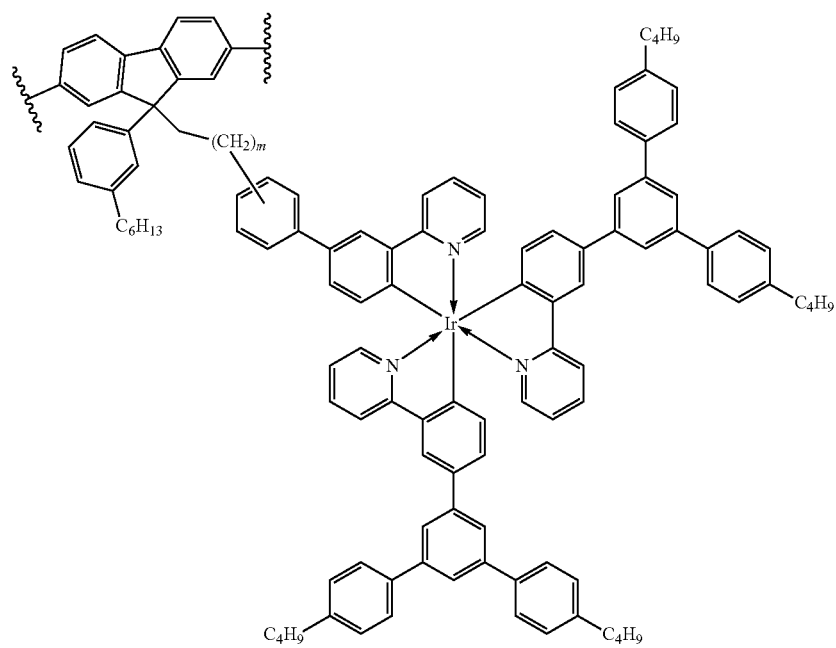

(16.3)

wherein X or a single bond adjacent a wavy line denotes the site of attachment to the polymer backbone and R denotes optional surface groups, which may be the same or different, but which are favourably t-butyl groups.

Unit δ may comprise 1 or 2 different iridium complexes but more suitably comprises 1 such iridium complex.

Unit δ may be present at 0.5 mole % to 15 mole % but favourably is present from 2 mole % to 6 mole %, such as about 3 mole %, 4 mole % or 5 mole % of the polymer.

The other units which may be present by up to 20 mole % are any that are compatible with the polymer comprising units α, β, γ and δ. Suitable units include those set forth in the aforementioned US Patent Application (US 2008/0100199A1) which is incorporated herein by reference in its entirety.

If such other units are employed they are generally non-conjugating units and replace a portion of units α.

Often it is preferred not to employ such other units so that the polymer consists essentially of, or consists of, units α, β, γ and δ.

By "red electroluminescent material" or "red light emitting polymer" or equivalents thereof is meant an organic material that by electroluminescence emits radiation having a wavelength in the range of 580-680 nm, preferably 590-660 nm, more preferably 610-640 nm and most preferably having an emission peak around 590-620 nm.

By "green electroluminescent material" or "green light emitting polymer" or equivalents thereof is meant an organic material that by electroluminescence emits radiation having a wavelength in the range of 500-580 nm, preferably 510-550 nm.

By "blue electroluminescent material" or "blue light emitting polymer" or equivalents thereof is meant an organic material that by electroluminescence emits radiation having a wavelength in the range of 380-500 nm, more preferably 430-500 nm. Aptly the emitters will be covalently bound into a polymer or mixed with a polymer.

"White light" as described herein may have CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-4500K.

The polymers of this invention may be employed in display devices, white emitting devices, and the like. Such devices optionally also comprise emitters of other colours, for example blue and red emitters.

An exemplary simple device according to the invention is described in FIG. 1.

With reference to FIG. 1, the architecture of a multi-layer electroluminescent device 10 according to the invention comprises a transparent glass or plastic substrate 11, an anode 12 e.g. of indium tin oxide (ITO) and a cathode 18. Three light emitting polymer (LEP) layers 13 and 15 and 17 and two optional barrier layers 14 and 16 are provided between the anode 12 and the cathode 18. The optional barrier 14 is provided to separate the LEP layers 13 and 15 and the optional barrier layer 16 is provided to separate the LEP layers 15 and 17. The device 10 may include optional further layers (not shown), such as a hole injection layer (HIL) between the anode layer 12 and the first LEP layer 13 or a hole transporting interlayer (IL) between the anode and light-emitting layers (or between the HIL, if present, and the light-emitting layers.

The first LEP layer 13 comprises a first electroluminescent polymer to provide phosphorescent green emission. This will be a polymer of the invention.

The second LEP layer 15 comprises a second electroluminescent polymer, or a blend of a host and emitter, to act as a fluorescent or phosphorescent red emitter.

The third LEP layer 17 comprises a third electroluminescent polymer, or a blend of a host and emitter, to act as a fluorescent or phosphorescent blue emitter.

The optional barrier layers 14 and 16 may have a triplet energy level higher than the triplet energy level of the phosphorescent green emitter of the first LEP layer 13. This high triplet energy prevents the migration of triplet energy states through the barrier layer, and so results in higher emission efficiency.

In a practical device, at least one of the electrodes is at least semi-transparent in order that light may be absorbed (in the case of a photoresponsive device) or emitted (in the case of an OLED). Where the anode is transparent, which is preferred, it typically comprises ITO. It is deposited on a transparent substrate, for example, glass or plastic.

Further optional layers may be located between anode 12 and cathode 16, such as charge transporting, charge injecting or charge blocking layers.

In particular, it is desirable to provide a conductive hole injection layer formed of a doped organic material located between the anode 12 and the electroluminescent layer 13 to assist hole injection from the anode into the layer or layers of semiconducting polymer. Examples of doped organic hole injection materials include poly(ethylene dioxythiophene) (PEDT), polyaniline as disclosed in U.S. Pat. No. 5,723,873 and U.S. Pat. No. 5,798,170, and poly(thienothiophene). Exemplary acids include PEDT doped with polystyrene sulfonate (PSS) as disclosed in EP 0901176 and EP 0947123, polyacrylic acid or a fluorinated sulfonic acid, for example Nafion®.

If present, a hole transporting layer located between anode 12 and electroluminescent layer 13 preferably has a HOMO level of less than or equal to 5.5 eV, more preferably around 4.8-5.5 eV. HOMO and LUMO levels as described herein may be measured by cyclic voltammetry.

If present, an electron transporting layer located between electroluminescent layer 15 and cathode 18 preferably has a LUMO level of around 3-3.5 eV.

The electroluminescent layers 13, 15 and 17 may consist of the electroluminescent material alone or may comprise the electroluminescent material in combination with one or more further materials. In particular, the electroluminescent material may be blended with hole and/or electron transporting materials as disclosed in, for example, WO 99/48160, or in layers 15 and 17 may comprise a luminescent dopant in a semiconducting host matrix. The electroluminescent material of layers 15 and/or 17 may be covalently bound to a charge transporting material and/or host material.

The anode may be comprised of indium tin oxide or other known suitable material.

The cathode 18 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of a metal. Alternatively, it may comprise a plurality of metals, for example a bilayer of a low workfunction material and a high workfunction material such as calcium and aluminium as disclosed in WO 98/10621. The cathode may contain a layer of elemental barium as disclosed in WO 98/57381, Appl. Phys. Lett. 2002, 81(4), 634 and WO 02/84759. The cathode may contain a thin layer of metal compound between the light-emitting layers and one or more conductive (e.g. metal) cathode layers, in particular an oxide or fluoride of an alkali or alkali earth metal, to assist electron injection, for example lithium fluoride as disclosed in WO 00/48258 or barium fluoride as disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

As stated previously, the cathode may be opaque or transparent. Transparent cathodes are particularly advantageous for active matrix devices because emission through a transparent anode in such devices is at least partially blocked by drive circuitry located underneath the emissive pixels. A transparent cathode will comprise a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as ITO.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

FIG. 1 illustrates a device which is formed by firstly forming an anode on a substrate followed by deposition of the various layers and a cathode, however it will be appreciated that the device of the invention could be provided with this architecture but could also be formed by firstly forming a cathode on a substrate followed by deposition of the various layers and an anode.

The cathode 18 may comprise any known electrode material, e.g. silver, aluminium or sodium fluoride, as would be understood by one skilled in the art. Moreover, the cathode 18 may comprise a multi-layer structure such that it provides the optimum work function for a specific device. For example, the cathode may comprise two, three, four or more layers of different electrode material.

When a voltage is applied across the device 10 the blue, green and red emitters emit light collectively make white light.

The present invention also relates to green light emitting devices such as, for example, may be used in displays. Examples of the construction of such devices are given in the Comparative Examples below.

Main group metal complexes show ligand based, or charge transfer emission. For these complexes, the emission colour is determined by the choice of ligand as well as the metal.

The host material and metal complex of layers 15 and 17 may be combined in the form of a physical blend. Alternatively, the metal complex may be chemically bound to the host material. However alternative arrangements of layers and interlayers may be employed as known to the skilled person.

The layers 13-17 of the device may be deposited sequentially onto the anode 22 (or an associated interlayer and/or hole transport layer if present) which is present on the substrate 11. Deposition may take place from solution, for example from a solvent such as diethylene glycol, phenoxytoluene, anisole, xylene, alkyl benzenes, or mixtures thereof. A particularly suitable solvent is toluene.

Generally the electroluminescent layer of polymer of this invention, for example when employed in a device of FIG. 1, is generally 10 nm to 200 nm thick, more favourably from 10 nm to 100 nm thick, for example about 25 nm to 50 nm thick, such as 30 nm thick.

The red and blue electroluminescent layers will generally be from 10 nm to 200 nm thick, more favourably from 10 nm to 100 nm thick, for example 25 nm to 50 nm thick, such as 30 nm thick.

Each of the green, red, and blue layers may independently be suitably 20 nm to 200 nm thick, more suitably 50 nm to 100 nm thick, for example 60 nm to 80 nm thick and may particularly aptly be 70±5 nm thick such as 65 nm, 66 nm, 67 nm, 68 nm, 69 nm, 70 nm, 71 nm, 72 nm, 73 nm, 74 nm to 75 nm thick.

Preferred methods for preparation of the polymers according to the invention are Suzuki polymerisation as described in, for example, WO 00/53656 and Yamamoto polymerisation as described in, for example, T. Yamamoto, "Electrically Conducting And Thermally Stable—Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups such as tosylate, mesylate and triflate.

A single polymer or a plurality of polymers may be deposited from solution to form a layer. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is not required, for example for lighting applications or simple monochrome segmented displays.

Inkjet printing is particularly suitable for high information content displays, in particular full colour displays. Inkjet printing of OLEDs is described in, for example, EP 0 880 303.

Other solution deposition techniques include dip-coating, roll printing, nozzle printing, slot-dye coating, and screen printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

The following Comparative Examples are not within the scope of the present invention and are described only to help illustrate the improvements produced by this invention. The following Examples help illustrate this invention and are not limiting to the scope of the invention.

Preparation of Dendrimeric Monomers

Reaction i

Using the methods described in US Patent Publication No. 2010/0033086 A1, which is hereby incorporated by reference in its entirety, the following compound was prepared:

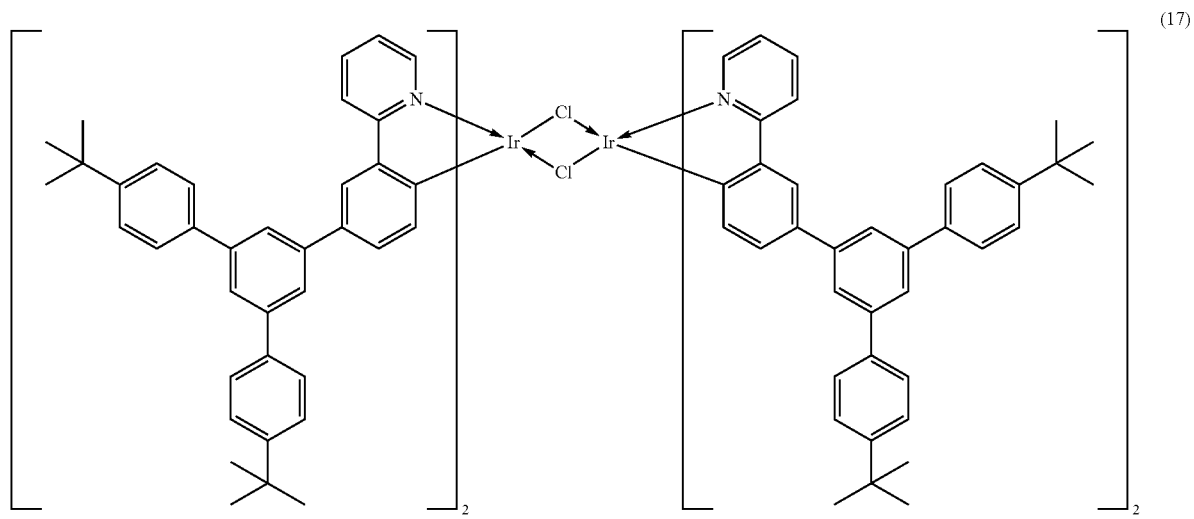

Reaction ii

Compound (17) was converted as described below to the compound of the formula (18):

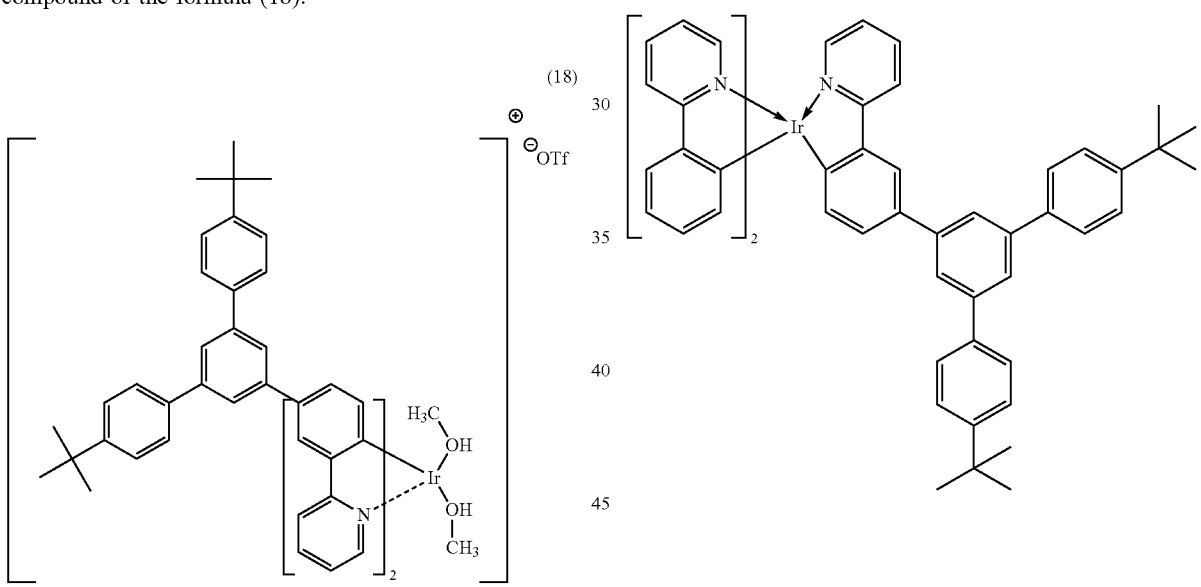

A solution of the material obtained in the first step (130 g, 57.4 mmol) in dichloromethane (2 L) was deoxygenated (with N₂) for 1 h. In a separate flask silver trifluoromethanesulfonate (31.45 g, 122.4 mmol) was dissolved in methanol (180 mL) under a nitrogen atmosphere and deoxygenated. The solution of silver trifluoromethanesulfonate was added slowly to the solution of the iridium complex and stirred at room temperature with the exclusion of light for 18 h. After this time the reaction mixture was passed through Celite filter medium and the medium washed with dichloromethane (1 L). The volatiles were removed under reduced pressure from the resultant orange filtrate to afford the intermediate as a semi-crystalline yellow solid that was used without further purification (156 g, 94%).

Reaction iii

The compound of Reaction ii was converted as described below to the compounds of formulae (19), (20) and (21):

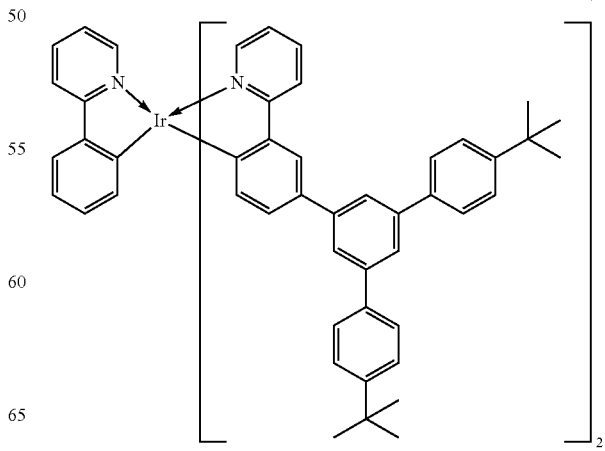

-continued

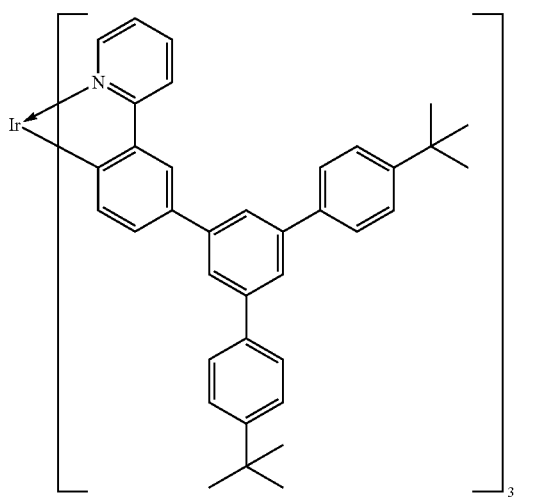

(21)

A mixture of the iridium trifluoromethanesulfonate complex as prepared in the previous Reaction (150 g, 105.6 mmol) and 2-phenylpyridine (36 g, 232.3 mmol) in ethanol (2.5 L) was deoxygenated (with $N_2$) for 1 h. The mixture was heated at reflux for 24 h under an atmosphere of nitrogen with the exclusion of light. After cooling, the resulting precipitate was collected by vacuum filtration, washed with a little methanol and dried (118 g crude solid). The ligand-scrambled mixture was separated by column chromatography on silica eluting with a gradient of dichloromethane (20-30%) in hexane to yield pure fractions (order of elution) of: the compound of the formula (19) above (ca. 10 g), the compound of the formula (20) above (62 g) and the compound of formula (21) above (ca. 4 g) as yellow solids. No significant quantities of Ir(ppy)$_3$ were detected.

Reaction iv

The compound of Reaction iii, formula (20), was converted as described below to the compound of formula (22):

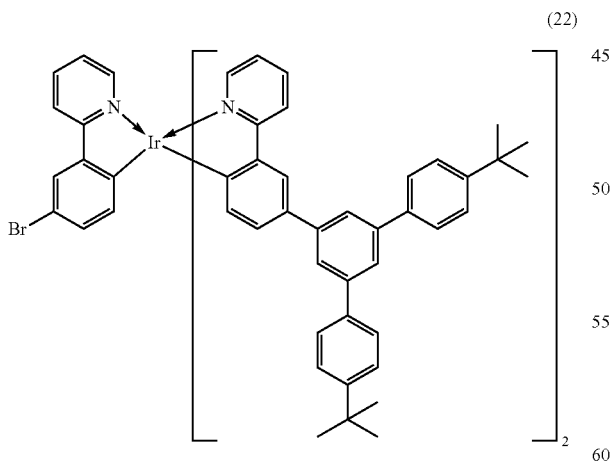

(22)

A solution of iridium complex the second eluting compound of the previous Reaction (34.2 g, 25.6 mmol) in dichloromethane (700 mL) was cooled down to 15° C. under an atmosphere of nitrogen. N-bromosuccinimide (4.57 g, 25.6 mmol) was added portion-wise at 15° C. and the solution was stirred overnight in the dark. TLC analysis confirmed that all the starting material had been consumed. Succinimide-based impurities were removed by passing the reaction solution through a silica plug eluting with dichloromethane (700 mL). The solvent was removed under reduced pressure to yield of the compound of the above formula (22) as a yellow-orange solid which was dried overnight at 40° C. in a vacuum oven (32 g, 88%).

Reaction v

The compound of Reaction iii, formula (20), was converted as described below into the compound of the formula (23):

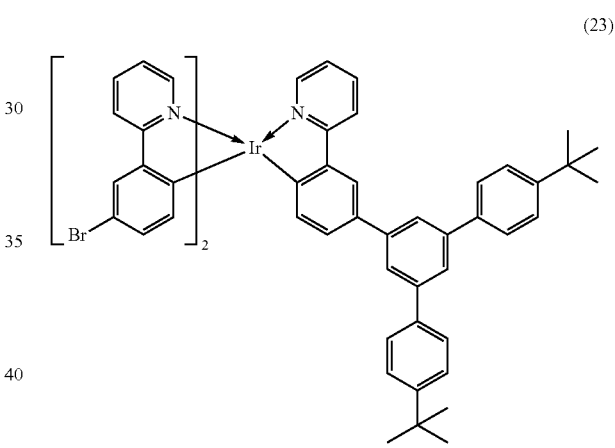

(23)

Following the procedure as described above the product of Reaction iv, (22), starting from the second eluting compound of Reaction iii (20), 4.5 g, 4.52 mmol), N-bromosuccinimide (2.4 g, 13.5 mmol) and dichloromethane (100 mL). After flash column chromatography over silica the desired dibromo compound (23) was isolated as a yellow solid (3.07 g, 59%).

Reaction vi

The compound of Reaction iv, (22), was converted as described below to the compound of the formula (24):

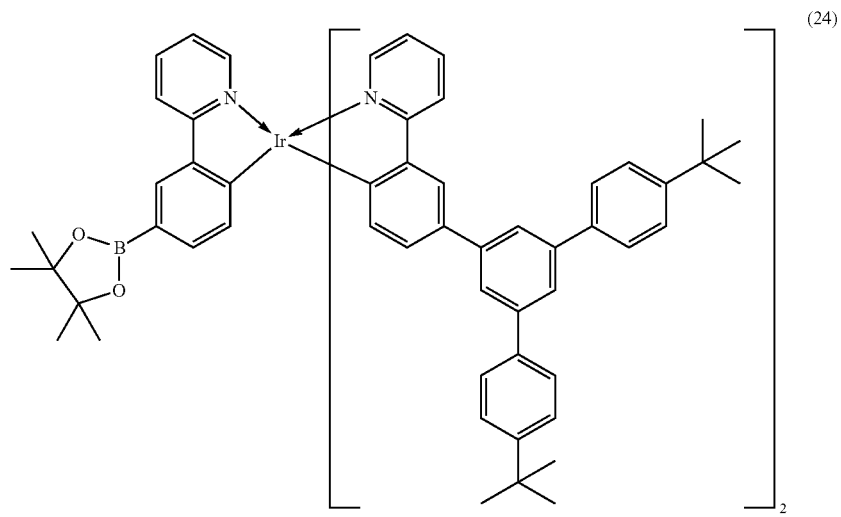

Iridium complex of Reaction iv (32.1 g, 22.69 mmol) and bis(pinacolato)diboron (6.34 g, 24.96 g, 1.1 equiv) were placed in a flask under an atmosphere of nitrogen. Anhydrous 1,4-dioxane (300 mL) was added via cannulation and the solution deoxygenated (with N2) for 1 h. PdCl$_2$(dppf).CH$_2$Cl$_2$ (0.278 g, 0.34 mmol), dppf (0.182 g. 0.34 mmol) and potassium acetate (6.68 g, 68.07 mmol, 3 equiv) were added to the flask. The reaction mixture was degassed for a further 30 min and then heated to 110° C. overnight. The dark coloured mixture was allowed to cool and then filtered through a plug consisting of Celite filter medium (12×1.5 cm) on top of Florisil (12×3 cm) on top of silica (12×3 cm). The plug was eluted with dichloromethane and the solvent was removed under reduced pressure to yield a brown foam (43 g). The foam was dissolved in the minimum amount of dichloromethane:hexane (2:3) and columned over silica eluting initially with a mixture of dichloromethane:hexane (2:3) to remove iridium complex impurity. The eluting solution mixture polarity was increased to dichloromethane:hexane (4:1) in order to elute the desired boronate. Fractions were combined and concentrated under reduced pressure to yield the desired iridium complex (24) (21.9 g, 66%).

Reaction vii

The compound of Reaction vi (24) was converted as described below to the compound of the formula (25):

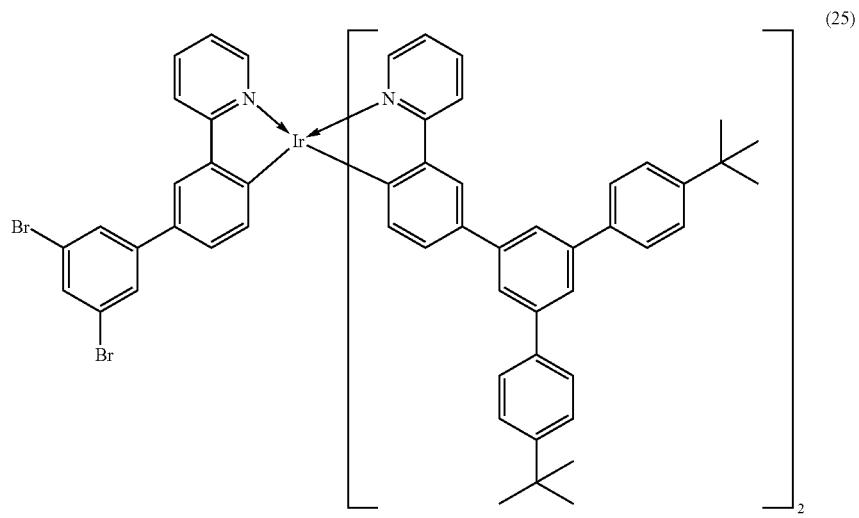

A solution of the boronate of Reaction vi (21.9 g, 14.98 mmol) and 1,3,5 tribromobenzene (21.5 g, 68.4 mmol) in toluene (300 mL) was deoxygenated (N$_2$) for 1 h. Simultaneously NEt$_4$OH (20% w/v aqueous solution, 22 mL, 29.96 mmol) was deoxygenated in a dropping funnel. Pd(PPh$_3$)$_4$ (0.519 g, 0.449 mmol) was added to the reaction flask, followed by drop-wise addition of the NEt$_4$OH solution. The reaction mixture was heated at 90° C. overnight under an atmosphere of nitrogen with the exclusion of light. TLC analysis confirmed that all the starting material had been consumed. After cooling to room temperature, water (100 mL) was added to the dark coloured reaction mixture. The organic layer was separated and washed with brine (3×50 mL), dried over MgSO$_4$ and the volatiles removed to afford a dark oily residue. The crude material was purified by column chromatography (2.5 kg silica) eluting with a 1:3 mixture of dichloromethane/hexane. High purity fractions (>99.5% purity HPLC) were combined, redissolved in the minimum amount of dichloromethane and precipitated with methanol. The precipitate was collected by filtration and dried overnight at 50° C. in a vacuum oven to yield the desired compound (25) as a bright yellow solid (16 g, 68%).
Reaction viii 1,3,5-tris(3-bromophenyl)-benzene was prepared by the condensation of 3-bromoacetophenone (100 g, 0.503 mol) in toluene (100 ml) in the presence of trifluoromethanesulfonic acid (0.8 ml) at reflux in a dean-Stark apparatus. After cooling to room temperature the precipitate was isolated by filtration, dissolved in dicholoromethane and passed through a plug of silica, eluting with dichloromethane. The volatiles were removed and the resulting pinkish solid recrystallised from hot toluene (400 ml). The white material isolated by filtration was then recrystallised from a mixture of toluene/hexane (200 ml:400 ml) to afford the product as white crystals (53 g).

The compound of Reaction iii (21) was converted essentially as described in Reaction v to the compound of the formula (26):

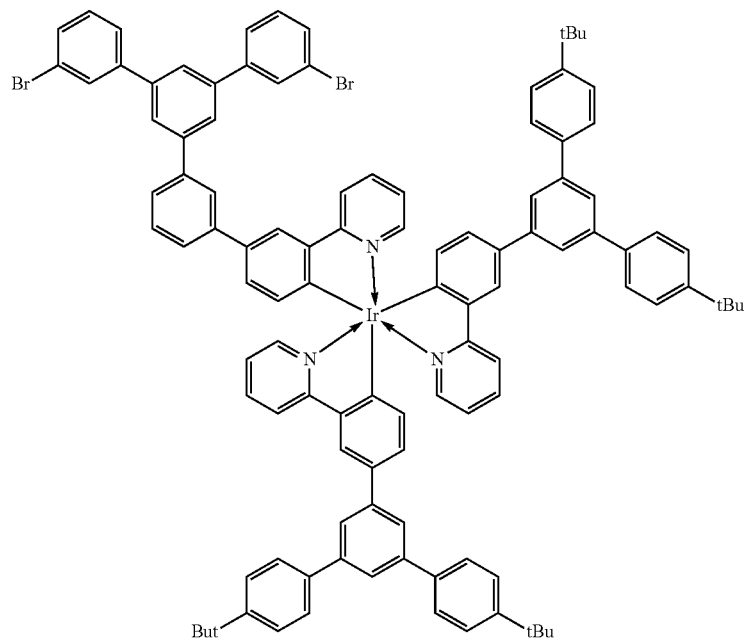

(26)

All polymers were prepared using 4.5 mmol of diester monomers and 4.5 mmol of dibromide monomers, with the ratios as described in the table above. Standard reaction conditions are as follows:

The monomers were accurately weighed out into a flask equipped with an overhead stirrer, reflux condenser and dinitrogen inlet/outlet. Toluene (100 ml) was added and the reaction mixture was thoroughly deoxygenated by bubbling dinitrogen gas through the solution. Simultaneously 15 ml of a 20% solution of tetraethylammonium hydroxide in water was deoxygenated by bubbling dinitrogen gas through the solution.

The reaction mixture was heated to 40° C., followed by the addition of Pd(OAc)$_2$ (3 mg) and tris(2methoxyphenyl)phosphine (19 mg) (in degassed toluene) and then drop wise addition of the deoxygenated solution of tetraethylammonium hydroxide. The reaction temperature was increased to 115° C. and the reaction stirrer speed was maintained at 350 rpm. After 20 h the reaction mixture was cooled to 50° C. and a deoxygenated solution of phenyl boronic acid pinacol ester (0.092 g, 0.45 mmol) in toluene (50 mL) was added, followed by Pd(OAc)$_2$ (3 mg) and tris(2methoxyphenyl)phosphine (19 mg) in degassed toluene. The reaction mixture was then heated to 115° C. for 14 hours and then allowed to cool to room temperature.

Polymers containing (33) were prepared by the same procedure with the exception that the reaction was carried out at 105 C and the stirrer speed was 500 rpm.

The reaction mixture was then heated to 65° C. and a solution of sodium diethyldithiocarbamic acid (2.5 g, 11.1 mmol) in distilled water (50 mL) was added and the polymer solution was stirred for 2 h at 65° C.

After cooling to room temperature, the organic layer was separated and washed sequentially with 2 M HCl (aq) (2×50 mL), 10% w/v NaOAc (aq) (2×50 mL) and distilled water (5×50 mL). All aqueous fractions were discarded. The crude polymer solution (ca. 150 mL) was added drop wise into MeOH (1.5 L) with stirring. The polymer precipitate was collected by filtration, redissolved in toluene (200 mL) and passed through a plug of Celite. After concentration to ca. (150-200 mL) the solution was again added drop wise into MeOH (2 L) with stirring. The precipitate was collected by filtration, redissolved in toluene (150 mL) and passed through a fluted filter paper. The polymer solution was finally added dropwise to a stirred solution of MeOH (1.5 L). The polymer was collected by filtration and dried overnight in a vacuum oven at 40° C.

Preparation of Monomer (39)

Monomer 39 was prepared according to the following reaction scheme:

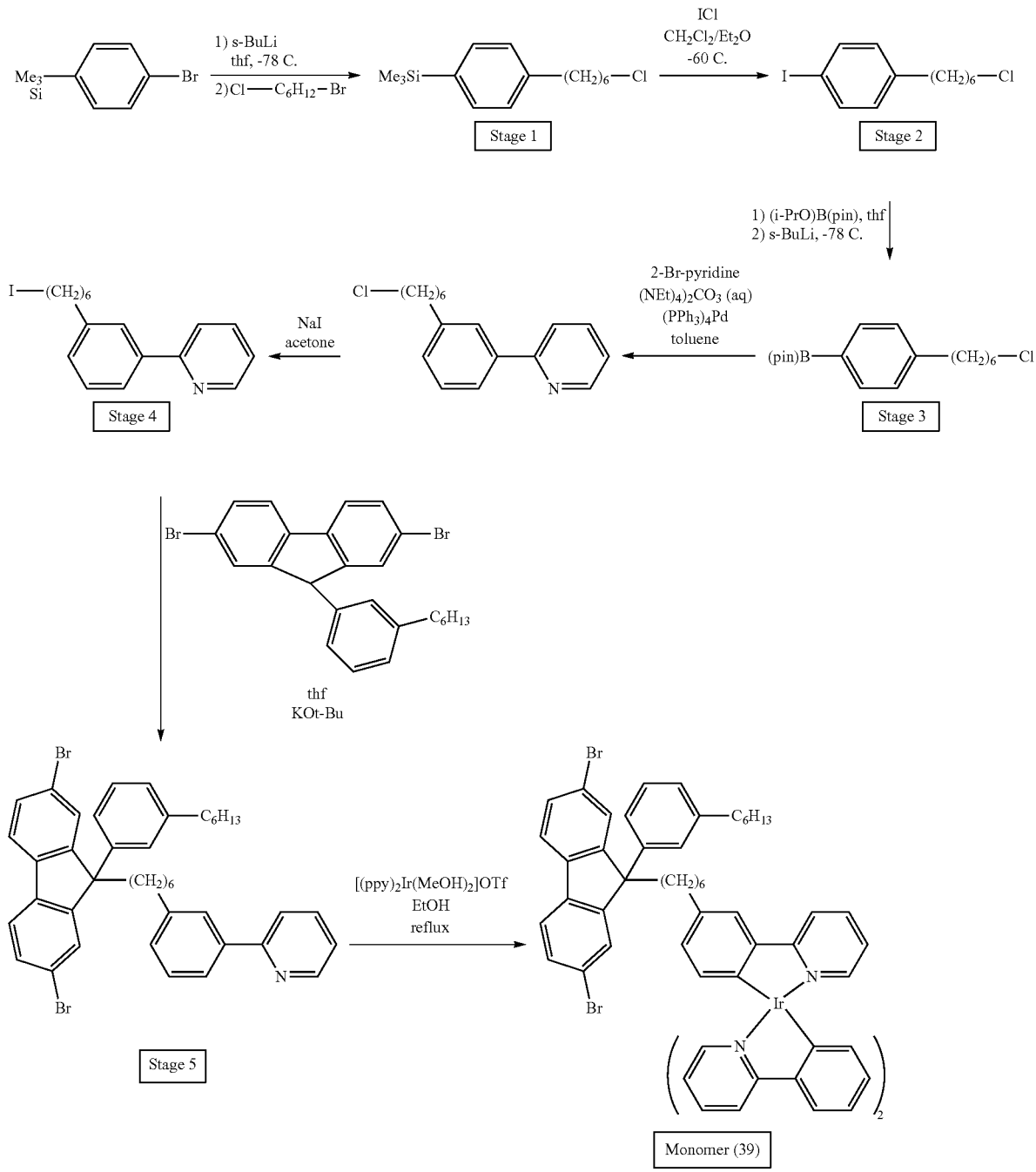

Stage 1: 1-bromo-4-(trimethylsilyl)benzene (96.26 g, 420.0 mmol) was placed in an oven-dried 3 L 3-neck round-bottom flask equipped with a reflux condenser fitted with a $N_2$ inlet/outlet, a dropping funnel and an overhead stirrer fitted with a Teflon blade.

Anhydrous THF (1 L) was added via cannula to the flask and the solution cooled to −78° C. using a dry ice acetone bath.

sec-Butyllithium (1.4 M solution in cyclohexane, 600 mL, 840.0 mmol) was added dropwise to the solution over a period of 4 h. The reaction was allowed to stir at −78° C. for a further 1 h. 1-chloro-6-bromohexane (100 g, 501.2 mmol) was added dropwise at −78° C. over a period of 30 min. The reaction was left to stir overnight with warming to room temperature. The reaction was carefully quenched at 0° C. by the dropwise addition of MeOH (50 mL). Volatiles were removed under reduced pressure and the crude mixture was redissolved in toluene. The organic mixture was washed with water (3×100 mL portions) to remove the lithium salts and dried over anhydrous $MgSO_4$. Filtration and concentration under reduced pressure yielded the Stage 1 product as a yellow oil (100 g, 88%) which was used in the next step without any further purification.

Stage 2: The material obtained in Stage 1 (100 g, 371.9 mmol) was placed in an oven-dried 5 L 3-neck round-bottom flask equipped with an overhead stirrer fitted with a Teflon paddle, reflux condenser fitted with an $N_2$ inlet/outlet and a dropping funnel. Anhydrous $CH_2Cl_2$ (1 L) and anhydrous $Et_2O$ (111 mL) were added to the flask and the solution cooled to −60° C. with a dry ice acetone bath. Iodine monochloride (1 M solution in $CH_2Cl_2$, 390 mL, 390 mmol) was added to the dropping funnel by a cannula and then added dropwise to the solution. The reaction was left to warm up to room temperature and stirred overnight.

GCMS analysis the following morning showed that the reaction had not gone to completion. The flask was cooled to 0° C. and further iodine monochloride (10 mL) added. The reaction was left to stir overnight.

The reaction was quenched by the dropwise addition of an aqueous solution of NaOH (2M, 600 mL). Careful agitation of the mixture caused the reaction mixture to turn from red to yellow. The organic layer was separated and dried over anhydrous $MgSO_4$. Filtration and concentration under reduced pressure yielded the Stage 2 product as an oil. Yield (94 g, 70%). The material was taken onto the next step without any further purification.

Stage 3: The Stage 2 product (135 g, 418.5 mmol) and 2-Isopropoxy-4,4,5,5-tetramethyl-1,3,2-dioxaborolane (108.9 g, 585.3 mmol) were placed in an oven-dried 5 L 3-neck round-bottom flask equipped with a reflux condenser and a $N_2$ inlet/outlet, an overhead stirrer fitted with a Teflon blade and a 500 mL pressure equalising dropping funnel.

Anhydrous THF (500 mL) was added via a cannula to the flask. The reaction flask was cooled to −78° C. using a dry ice acetone bath. sec-Butyllithium (1.4 M solution in cyclohexane, 600 mL, 840.0 mmol) was added to the dropping funnel via a cannula and then allowed to add dropwise to the reaction solution over a period of 3.5 h. The temperature of the dry ice acetone bath was maintained at −78° C.

The reaction was allowed to warm to room temperature overnight and was then carefully quenched by the dropwise addition of MeOH (100 mL) at 0° C.

Concentration under reduced pressure yielded the product as a yellow-orange oil. The crude Stage 3 product was redissolved in toluene (500 mL) and washed with a saturated aqueous solution of NaCl (3×200 mL). The product was passed through a silica plug eluting with a mixture of hexanes in $CH_2Cl_2$ (4:1). Yield (67.5 g, 50%). The material was taken onto the next stage without any further purification.

Stage 4: 2-pyridyl bromide (26.13 g, 165.5 mmol) and the Stage 3 product (53.4 g, 165.5 mmol) were placed in an oven-dried 2 L 3-neck round-bottom flask equipped with a reflux condenser fitted with an $N_2$ inlet/outlet and an overhead stirrer fitted with a Teflon blade. Toluene (500 mL) was added to the flask and the solution was thoroughly degassed with $N_2$ for 1 h. Simultaneously a 33% w/v aqueous solution of $[NEt_4]_2CO_3$ (125 mL, 387.8 mmol) was degassed with $N_2$. $[(Ph_3P)_4Pd]$ (3.81 g, 3.30 mmol) was added to the reaction flask followed by the degassed solution of $[NEt_4]_2CO_3$. The reaction was heated at reflux for 22 h.

After cooling, the aqueous layer was removed and the toluene solution passed through a silica plug eluting with toluene/EtOAc (4:1, 5 L). The filtrate was concentrated under reduced pressure to yield a viscous oil (45 g).

The crude product was purified in 3×15 g batches by automatic column chromatography (Isolera SNAP 340 g cartridge) eluting with a mixture of EtOAc in hexanes (1:10). The Stage 4 product was isolated as a pale yellow coloured oil (26.69 g, 59%). The Stage 4 chloride (23.20 g, 84.73 mmol) was converted to the Stage 4 iodide by the Finkelstein halide exchange reaction (NaI in acetone). (Yield 27 g, 87%).

Stage 5: 2,7-dibromo-9-(3-hexylphenyl)fluorene (31.51 g, 65.06 mmol) was placed in an oven-dried 1 L 3-neck round-bottom flask equipped with a reflux condenser fitted with an $N_2$ inlet/outlet, a 250 mL dropping funnel and an overhead stirrer fitted with a Teflon blade. The flask was flushed with $N_2$.

Anhydrous THF (400 mL) was added via a cannula through the septum fitted to the dropping funnel. The dropping funnel was removed and replaced by a septum. The solution was thoroughly degassed for 1 h. Simultaneously, a solution of the Stage 4 product (26.14 g, was placed in a 250 mL flask and sealed with a septum. The flask was carefully flushed with $N_2$. Anhydrous THF (100 mL) was added via a cannula to the flask and the resulting solution was thoroughly degassed with $N_2$ for 1 h.

An ice-bath was placed around the 1 L round-bottom flask and the solution cooled to 0° C. KO$^t$Bu (8.03 g, 71.6 mmol) was added portionwise to the solution of 2,7-dibromo-9-(3-hexylphenyl)fluorene under $N_2$. The resulting red solution was allowed to stir for a further 5 min and was continuously degassed with $N_2$.

The solution of the Stage 4 product was added portionwise (ca. 20 mL via a syringe) with stirring to the red solution. On addition, the red solution turned orange. The orange solution was degassed for a further 1 h. The ice bath was removed, degassing stopped, and the orange solution allowed to warm up to room temperature and left overnight.

GCMS analysis showed that the reaction had gone to completion. The reaction flask was cooled via an ice bath to 0° C. and water (400 mL) was added portionwise to quench the reaction. The aqueous solution was extracted with $CH_2Cl_2$ (3×400 mL). Organic fractions were combined and dried over anhydrous $MgSO_4$. The mixture was filtered and concentrated under reduced pressure to yield crude Stage 5 product as a viscous red oil.

The red oil was purified in two batches via automatic column chromatography [2×340 g Isolera SNAP cartridges] eluting with a gradient of $CH_2Cl_2$ in hexanes (1:3). The main band from each column was collected. The product from both columns was combined and re-columned as above. Like fractions (TLC analysis) were combined and concentrated under reduced pressure to yield the Stage 5 product as a colourless viscous oil (37 g, 79%).

Monomer (39): The iridium precursors $[Ir(ppy)_2Cl]_2$[1] and $[Ir(ppy)_2(MeOH)_2]OTf$[2] were prepared as reported in the literature.

[1] Sprouse, S.; King, K. A.; Spellane, P. J.; Watts, R. J. *J. Am. Chem. Soc.* 1984, 106, 6647-6653.

[2] Schmid, B.; Garces, F. O.; Watts, R. J. *Inorg. Chem.* 1994, 33, 9-14.

The Stage 5 product (35.00 g, 48.5 mmol) was placed in a 2 L 3-neck round-bottom flask equipped with a reflux condenser fitted with an $N_2$ inlet/outlet and an overhead stirrer fitted with a Teflon blade. Absolute EtOH (1 L) was added to the flask and the solution thoroughly degassed with stirring for 1 h. $[Ir(ppy)_2(MeOH)_2]OTf$ (17.30 g, 24.2 mmol) was added to the solution and the mixture degassed for a further 10 min. The mixture was then heated at reflux for 22 h. After allowing the reaction to cool to room temperature volatiles were removed under reduced pressure to yield the crude ligand-scrambled mixture of iridium complexes as a yellow/orange solid.

Monomer (39) was purified via automatic column chromatography. First, excess Stage 5 product ligand was removed from the ligand-scrambled mixture of iridium complexes by eluting with a gradient of $CH_2Cl_2$ in hexanes [Isolera SNAP 340 g cartridge].

Monomer (39) was separated from the ligand-scrambled mixture of iridium complexes by eluting with hexanes in toluene (1:3) [Isolera SNAP 750 g cartridge]. After TLC analysis like fractions were combined and concentrated under reduced pressure to yield Monomer (39) as a yellow solid (8.65 g, 29%).

Monomer (39) was purified by preparative HPLC (1 g in ca. 2.5 L MeCN).

TABLE 1

Examples 1 to 15, compositions given as mole percentages

| Examples | diester | dibromide |
|---|---|---|
| 1 | 50% (28) | 5.1% (36) 14.5% (26) 20.3% (30) 10.1% (29) |
| 2 | 50% (28) | 5% (26) 37.5% (29) 7.5% (32) |
| 3 | 50% (28) | 5.1% (36) 14.5% (26) 20.3% (30) 7.6% (32) 2.5% (29) |
| 4 | 50% (28) | 20% (30) 10% (32) 10% (35) 2.05% (26) 7.95% (34) |
| 5 | 50% (28) | 20% (30) 10% (32) 10% (35) 3.2% (26) 6.8% (34) |
| 6 | 50% (28) | 5% (26) 25% (29) 20% (32) |
| 7 | 50% (28) | 20% (30) 10% (29) 3.2% (25) 16.8% (34) |
| 8 | 35% (28) 15% (27) | 32.2% (36) 10% (30) 7.8% (25) |
| 9 | 35% (28) 15% (27) | 17.2% (36) 25% (30) 7.8% (25) |
| 10 | 50% (28) | 32.2% (36) 10% (30) 7.8% (25) |
| 11 | 50% (28) | 32.26% (36) 11.5% (30) 6.24% (25) |
| 12 | 50% (28) | 33.82% (36) 11.5% (30) 4.68% (25) |
| 13 | 50% (28) | 33.82% (36) 11.5% (38) 4.68% (25) |
| 14 | 50% (28) | 20.7% (36) 11.5% (38) 7.8% (25) 5% (35) 5% (33) |
| 15 | 50% (28) | 20.7% (36) 11.5% (30) 7.8% (14) 5% (35) 5% (33) |

The monomer numbers in the above table refer to the following compounds:

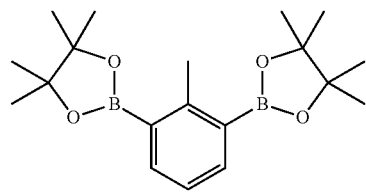
(27)

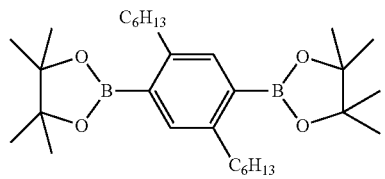
(28)

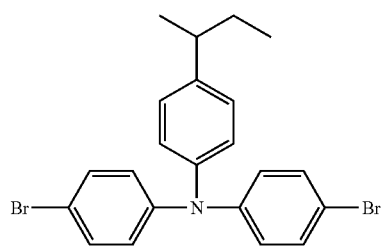
(29)

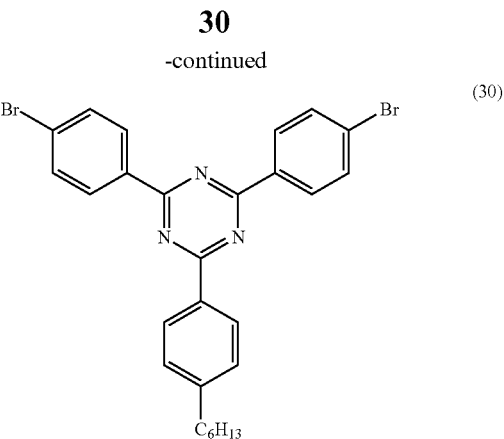
(30)

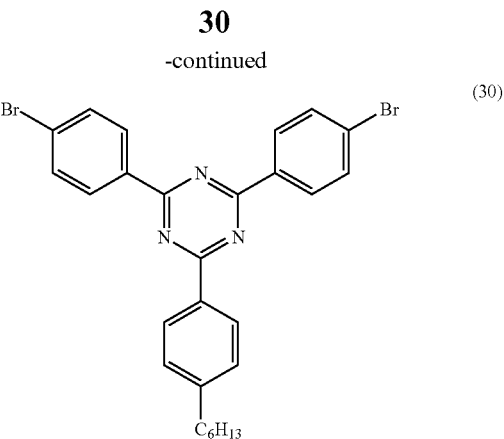
(31)

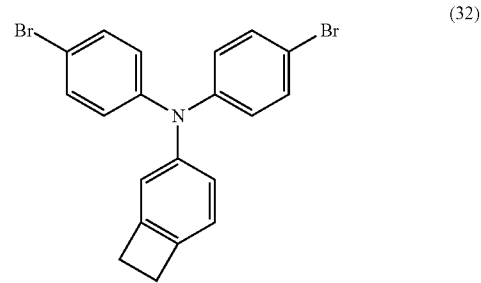
(32)

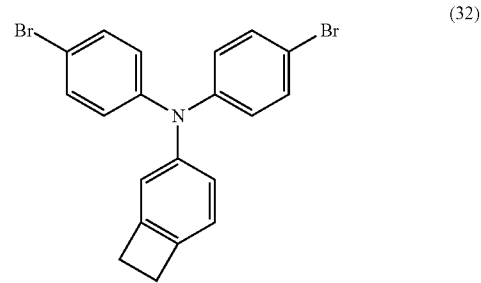
(33)

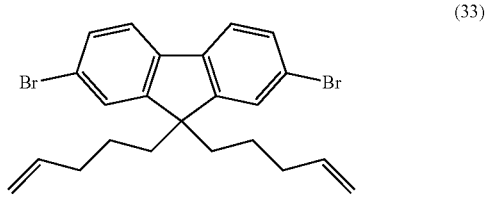
(34)

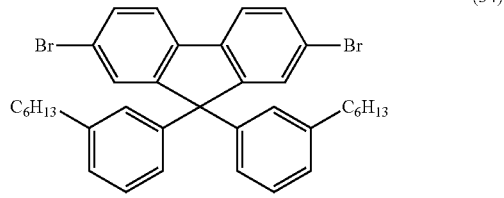
(35)

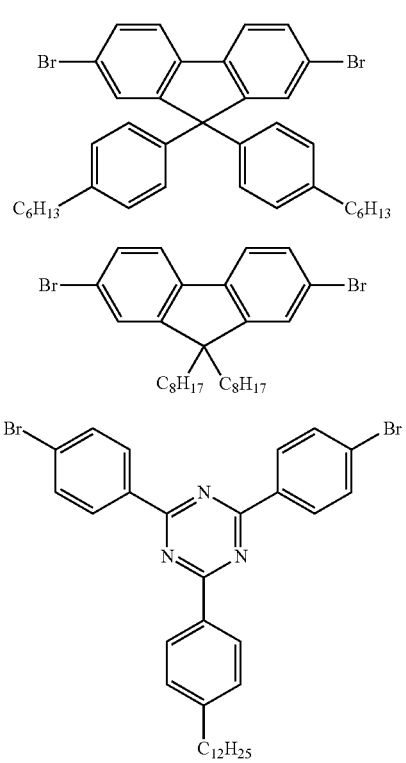

(36)

(37)

(38)

COMPARATIVE EXAMPLES

Comparative Example 1

A polymer was prepared of 50 mole % compound (28), 40 mole % compound (36), and 10 mole % compound (30) into which was blended compound (21) as prepared in Reaction iii. The resulting blend contained 7.8 mole % of Ir complex and 92.2 mole % of polymer backbone units.

Two light emitting devices were provided each of which comprised in sequence: (a) a glass substrate with an ITO anode thereon; (b) a 30 nm spin-coated PEDOT hole injection layer; (c) an interlayer consisting of a spin-coated polymer formed by Suzuki polymerization of 50 mole % compound (28), 42.5 mole % compound (31), and 7.5 mole % compound (32), wherein the interlayer was crosslinked following deposition; (d) a 70 nm thick spin-coated electroluminescent layer that in the first device was the comparative polymer: Ir complex blend described above and the electroluminescent layer in the second device was the polymer of Example 10 above; and (e) a cathode consisting of a 100 nm thick Ag layer and a 200 nm thick Al layer.

Figure 2:
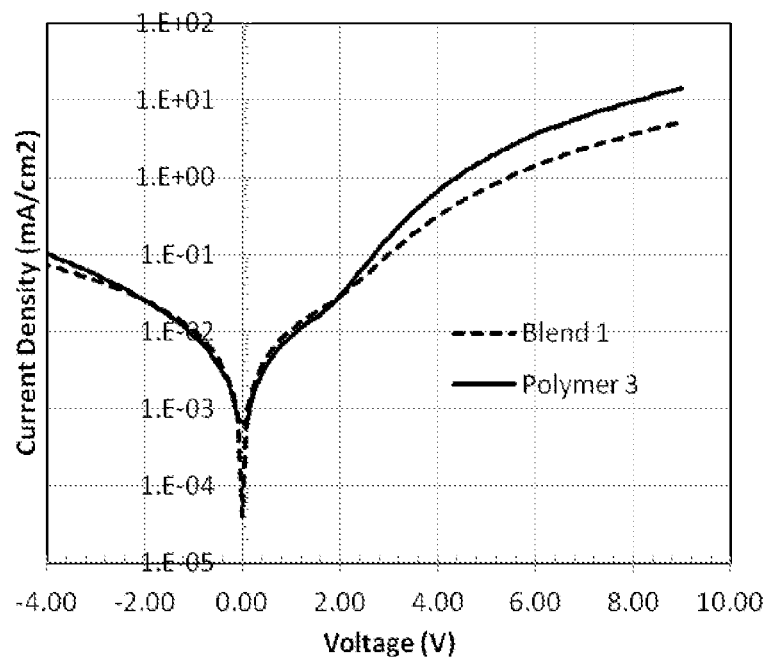
FIG. 2 is a graph of current density vs. voltage for a device according to an embodiment of the invention and a comparative device.

FIG. 2 shows that at the same voltage the hole current passing through the single component green polymer according to the present invention (solid line) is larger than that of the blend (broken line) indicating that the iridium dendrimer is more effective at transporting holes when attached to the chain than when blended with a host polymer.

Comparative Example 2

It is preferable to optimize the balance of positive (hole) and negative (electron) charge carriers.

Three light emitting devices were provided each of which comprised in sequence: (a) a glass substrate with an ITO anode thereon; (b) a 50 nm spin-coated PEDOT hole injection layer; (c) a 22 nm thick interlayer consisting of a spin-coated polymer formed by Suzuki polymerization of of 50 mole % (34); 30 mole % compound (31), 12.5 mole % compound (37), and 7.5 mole % compound (35), wherein the polymer was crosslinked following deposition; (d) a 74-76 nm thick spin-coated electroluminescent layer that was either the blend of Comparative Example 1, or the polymer of Example 12 or the polymer of Example 10; and (e) a NaF/Ag/Al cathode. Data shown in Table 2 were measured at 1000 cd/m$^2$ and in which T70 is the time taken for the devices to fall to 70% of their initial luminance at constant current. The data indicates that polymers according to the present invention provide can provide at least comparable performance compared to blends using substantially lower amounts of Ir. In this example a 40% reduction in Ir was achieved.

TABLE 2

| EL layer | Voltage (V) | Current (mA) | Efficiency (Cd/A) | Quantum Efficiency (%) | CIE x | CIE y | T70 lifetime (h) |
|---|---|---|---|---|---|---|---|
| Comparative Example 1 | 5.17 | 2.5 | 39.44 | 10.42 | 0.288 | 0.653 | 5850 |
| Example 12 | 5.14 | 2.5 | 40.69 | 11.31 | 0.283 | 0.655 | 1000 |
| Example 10 | 5.31 | 2.4 | 41.05 | 11.48 | 0.281 | 0.653 | 5600 |

Comparative Example 3

A polymer was prepared strictly analogous to that of Example 7 except that the dendrimer of formula (25) (pendant) was substituted with the dendrimer of formula (23) (in-chain).

Light emitting devices were prepared using a first layer comprising a polymer of 50% (28), 42.5% (31), 7.5% (32) and a second layer either of the polymer of this comparative Example or the polymer of Example 7. It was found that the device comprising the polymer of this invention has a lifetime of about 40% greater than that of the comparative example.

Light emitting devices were provided each of which comprised in sequence: (a) a glass substrate with an ITO anode thereon; (b) a 48 nm spin-coated PEDOT hole injection layer; (c) a 23 nm thick interlayer consisting of a spin-coated polymer consisting of 50 mole % (34), 42.5 mole % compound (31) and 7.5 mole % compound (35); (d) a 67-74 nm thick spin-coated electroluminescent layer that was either the polymer of Example 7, or Example 7 polymer in which dendrimer of formula (25) was substituted with dendrimer of formula (23); and (e) a NaF/Ag/Al cathode. Data shown in Table 3 were measured at 1000 cd/m$^2$ and show improved lifetime for a polymer according to the present invention compared to a polymer in which the dendrimer is in-chain.

TABLE 3

| EL layer dendrimer | CIE x | CIE y | Voltage (V) | Current (mA) | Efficiency (Cd/A) | Quantum Efficiency | T70 lifetime (h) |
|---|---|---|---|---|---|---|---|
| (23) | 0.312 | 0.631 | 3.91 | 1.7 | 58.01 | 16.48 | 350 |
| (25) | 0.312 | 0.633 | 3.9 | 1.9 | 52.15 | 14.71 | 462 |

White-Emitting Device Example

An organic light-emitting device having the following structure was formed on a glass substrate:
ITO/HIL (50 nm)/HTL (21 nm)/ELG (31 nm)/ELR (10 nm)/ELB (49 nm)/Cathode
wherein ITO is an indium-tin oxide anode; HIL is a layer of hole-injection material available from Plextronics Inc., a HTL is a hole transporting layer; ELG is a light-emitting layer including a green phosphorescent light-emitting material; ELR is a red phosphorescent light-emitting layer; ELB is a blue fluorescent light-emitting layer; and Cathode is a cathode comprising a trilayer of a metal fluoride, aluminium and silver.

HIL, HTL, ELG, ELR and ELB were each formed by spin-coating a solution comprising the components of that layer and a solvent, and evaporating the solvent. HTL, ELG and ELR comprise crosslinkable groups that were cross-linked prior to spin-coating of the overlying layer.

HTL was formed by spin-coating Hole Transporting Polymer 1 formed by Suzuki polymerisation, as described in WO 00/53656, of the following monomers:

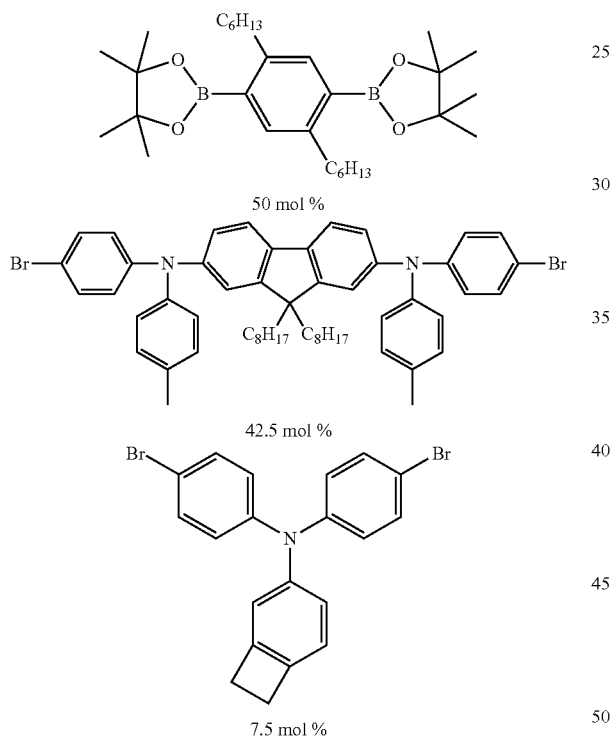

ELG was formed by spin-coating a polymer formed by Suzuki polymerisation, as described in WO 00/53656, of monomers and a red phosphorescent end-capping unit in the following molar percentages:

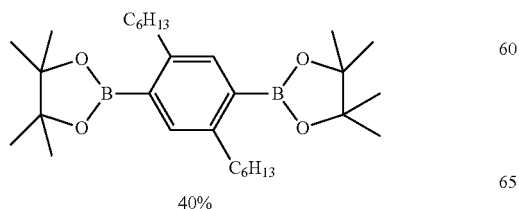

40%

-continued

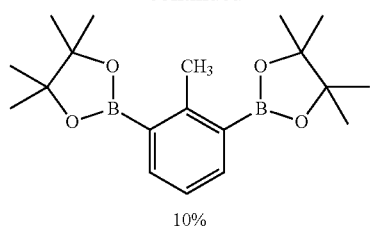

10%

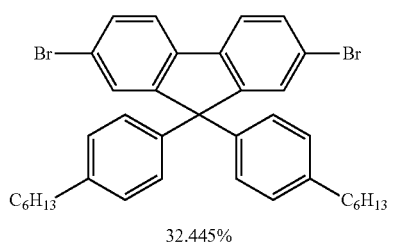

32.445%

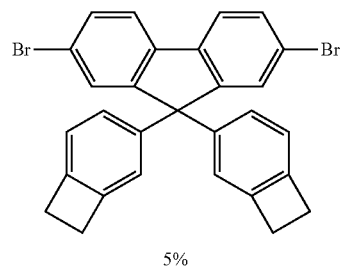

5%

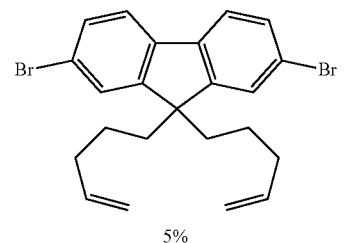

5%

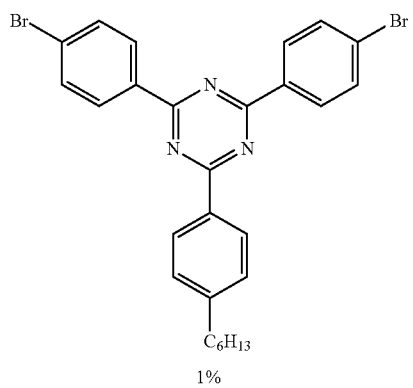

1%

-continued
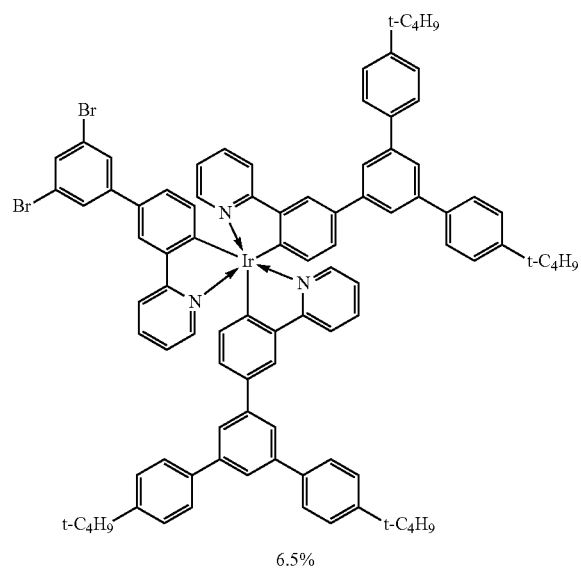
6.5%
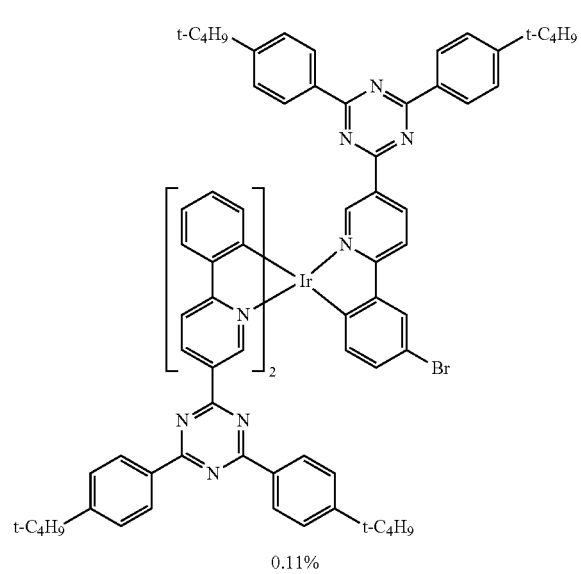
0.11%
ELG includes both a green phosphorescent repeat unit and a red phosphorescent end-capping group.
ELR was formed by spin-coating Red Polymer 1 formed by Suzuki polymerisation, as described in WO 00/53656, of monomers and a red phosphorescent end-capping unit in the following molar percentages:
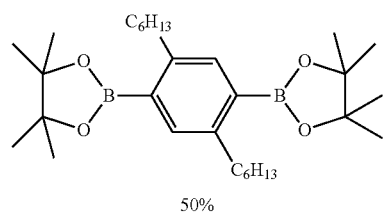
50%
-continued
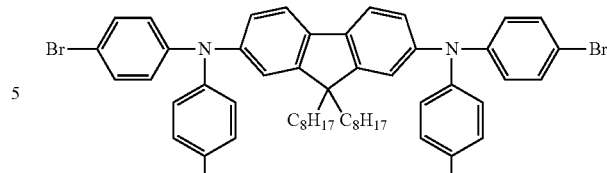
18.258%
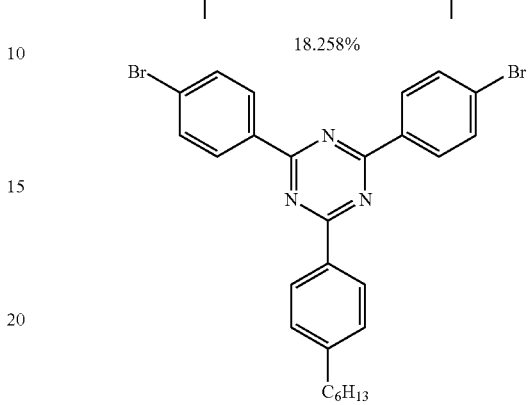
11%
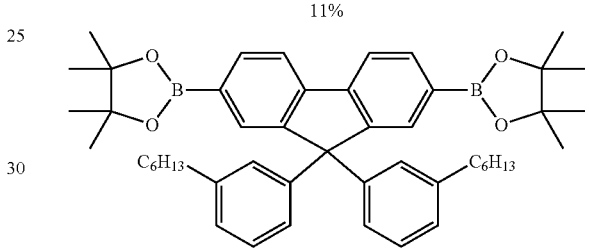
10.667%
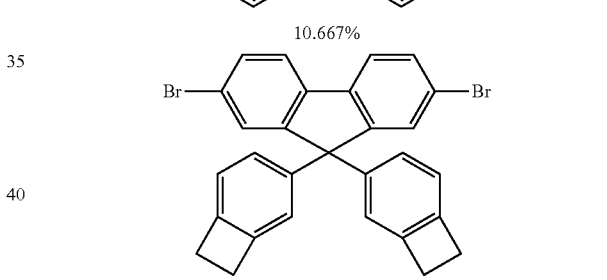
10%
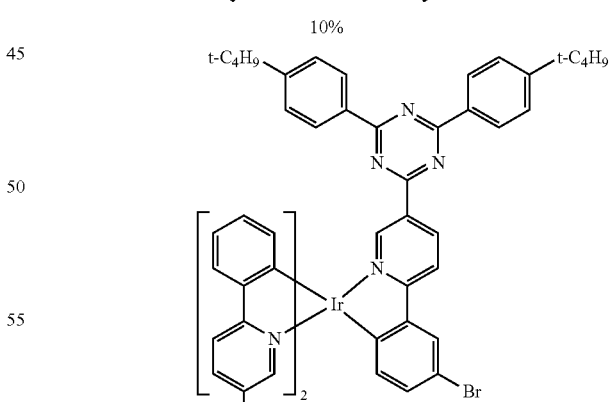
0.15%

ELB was formed by spin-coating Blue Polymer 1 formed by Suzuki polymerisation, as described in WO 00/53656, of monomers in the following molar percentages:

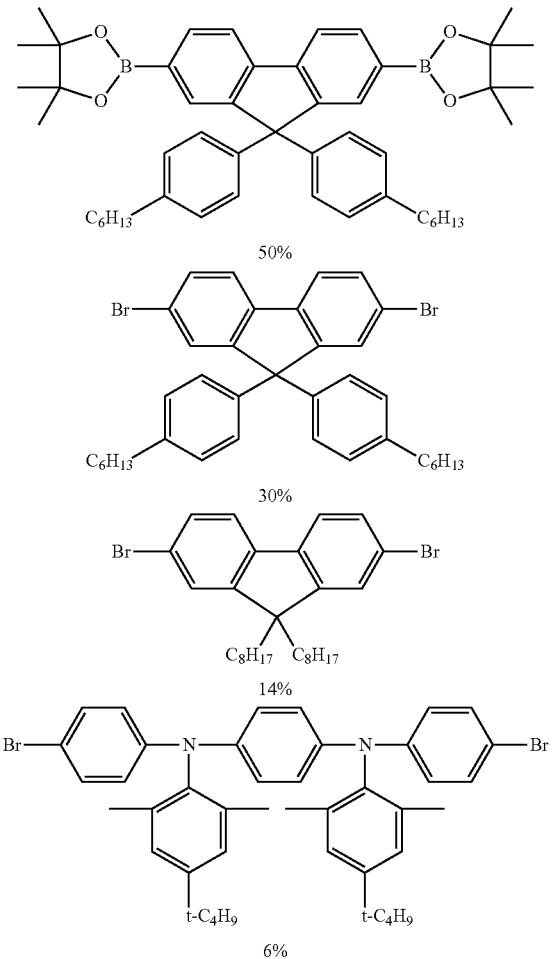

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A polymer comprising units α, β, γ and δ wherein:
    unit α is present at 30 mole % to 60 mole % and is an optionally substituted arylene;
    unit β is present at 1 mole % to 30 mole % and is a unit comprising an optionally substituted fluorene;
    unit γ is present at 1 mole % to 40 mole % and comprises aryl substituted nitrogen, or an optionally substituted triazine;
    unit δ is present at 0.5 mole % to 15 mole % and comprises an iridium complex;
and optionally up to 20 mole % of other units if the total of α, β, γ and δ is less than 100 mole %.

2. A polymer as claimed in claim 1 wherein the optionally substituted arylene group is an optionally substituted 1,4-phenylene group.

3. A polymer as claimed in claim 1 wherein the unit β is of the formula:

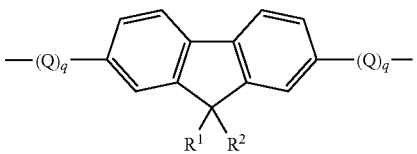

where $R^1$ and $R^2$ are independently alkyl, alkenyl, alkaryl, aralkyl, aryl, optionally aryl of up to 20 carbon atoms, or substituted aralkyl where the substituent on the aralkyl or aryl group is one lower alkyl group or two lower alkyl groups optionally linked to form a ring of 4 to 6 carbon atoms;

and where q is 0 or 1 and Q is attached to the fluorene through the nitrogen atom of a group of the formula:

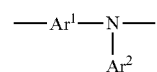

wherein $Ar^1$ is a phenylene group optionally substituted by one or two lower alkyl or lower alkoxy groups and $Ar^2$ is a phenyl group optionally substituted by one or two lower alkyl or lower alkoxy groups.

4. A polymer as claimed in claim 1 which comprises more than one type of β unit.

5. A polymer as claimed in claim 1 which comprises at least one type of β unit wherein q is 0 and at least one type of β unit wherein q is 1.

6. A polymer as claimed in claim 1 wherein unit γ is linked into the polymer via each of two arylene groups.

7. A polymer as claimed in claim 1 wherein unit γ comprises triazine substituted with a phenyl group, and wherein the phenyl group is optionally substituted by an alkyl group of 1 to 20 carbon atoms.

8. A polymer as claimed in claim 1 wherein unit δ comprises three phenylpyridyl ligands.

9. A polymer as claimed in claim 1 wherein the iridium complex is a dendrimer comprising at least one dendron.

10. A polymer as claimed in claim 1 wherein unit δ is an arylene repeat unit that the iridium complex is bound to.

11. A polymer as claimed in claim 10 wherein the iridium complex is bound directly to the arylene repeat unit or linked thereto by a chain.

12. A polymer according to claim 1 wherein the polymer comprises up to 10 mole % of other units if the total of α, β, γ and δ is less than 100 mole %.

13. A process for the preparation of a polymer as claimed in claim 1 which comprises the reaction of unit monomers together by Suzuki polymerization.

14. A white light emitting device which comprises a polymer as claimed in claim 1 and a blue electroluminescent material and a red electroluminescent material.

15. A device as claimed in claim 14 in which the polymer, the blue electroluminescent material and the red electroluminescent material are in three different electroluminescent layers.

* * * * *